United States Patent [19]

Wellington

[11] 3,983,623
[45] Oct. 5, 1976

[54] METHOD FOR MOUNTING SOCKET CONTACTS TO DUAL-IN-LINE PACKAGE LEADS AND FOR MOUNTING THE COMBINATION ONTO PRE-DRILLED PRINTED CIRCUIT BOARDS

[75] Inventor: Roger D. Wellington, Chestnut Hill, Mass.

[73] Assignee: Augat, Inc., Attleboro, Mass.

[22] Filed: June 30, 1975

[21] Appl. No.: 591,413

[52] U.S. Cl. .................................. 29/626; 29/628
[51] Int. Cl.² .................................. H05K 3/30
[58] Field of Search .......... 29/625, 626, 628, 630 R, 29/630 B, 203 R, 203 J, 203 P, 423, 429, 577, 589, 591; 339/17 R, 17 C, 17 CF, 17 M, 276 R; 317/101 C, 101 D, 101 CC, 101 CM; 174/52 R, 68.5, 52 FP

[56] References Cited
UNITED STATES PATENTS

| | | | |
|---|---|---|---|
| 2,937,358 | 5/1960 | Bulger | 317/101 CC |
| 3,611,562 | 10/1971 | Herb | 29/626 |
| 3,834,015 | 9/1974 | DiRenzo | 29/628 |

*Primary Examiner*—C.W. Lanham
*Assistant Examiner*—James R. Duzan
*Attorney, Agent, or Firm*—Weingarten, Maxham & Schrugin

[57] ABSTRACT

A method for mounting socket contacts to the leads of electronic component packages having a dual-in-line configuration, and for one-step mounting of the pre-socketed packages to dual-in-line arrays of holes in a panel board. Dual-in-line packages (DIP) are fed to a processor where a plurality of socket contacts are separated into two parallel spaced rows and the leads of the DIP are inserted into the sockets. The thus presocketed DIP's are repackaged for further handling, to ultimately be assembled to a panel board wherein dual-in-line arrays of holes have been drilled. The ends of the socket contacts projecting from the back side of the board are normally wave soldered for permanent electrical connection, while the IC remains in position secured to the board by means of the socket contacts.

11 Claims, 6 Drawing Figures

METHOD FOR MOUNTING SOCKET CONTACTS TO DUAL-IN-LINE PACKAGE LEADS AND FOR MOUNTING THE COMBINATION ONTO PRE-DRILLED PRINTED CIRCUIT BOARDS

FIELD OF THE INVENTION

This invention relates generally to electronic panel boards and more particularly concerns a one-step procedure whereby a pre-socketed dual-in-line electronic circuit package is mounted to a pre-drilled panel board.

BACKGROUND OF THE INVENTION

It has been standard practice to prepare a panel board with a multiplicity of dual-in-line arrays of holes in which lead sockets are inserted. These sockets have been inserted individually by hand, and by means of a recent innovation where the socket contacts are assembled onto a carrier which is a simple device having a dual-in-line configuration of projections from a thin, flat body onto which the socket contacts have been mounted. This loaded carrier is then placed in position and the contacts are inserted into the dual-in-line arrays of holes in the panel board. The carrier is then removed and disposed of, either by being thrown away or recycled. The next step in panel board assembly is to mount a dual-in-line electronic circuit package (DIP), such as an integrated circuit package, to the panel board with its leads being inserted into the socket contacts mounted in the panel board. The DIP is often pre-loaded onto an adaptor or insulator socket, or the insulator socket is mounted to the board before the DIP is mounted thereto. In some cases, use of the insulator socket increases the overall thickness of the electronic panel board and, by being slightly wider than the dual-in-line arrays of holes and socket contacts, both in panel board area used and in proximity of panel boards, density is somewhat less than optimum. Examples of insulator sockets are shown in U.S. Pat. Nos. 3,825,876, 3,605,062, 3,644,792, 3,441,853 and 3,673,543.

It may be noted that several steps are involved in combining DIP's with panel boards: socket contacts are mounted to a carrier; the carrier and contacts are then mounted to the panel board; the carrier is removed and disposed of; and a DIP is mounted to the socket contacts in the panel board. As one alternative: the socket contacts are individually assembled to the board in a time consuming process; and the DIP is mounted thereto.

SUMMARY OF THE INVENTION

This invention simplifies the procedures for mounting both the socket contacts and the DIP's to a pre-drilled panel board. As compared with the prior art, the steps have been simplified to: mounting the socket contacts onto the leads of the DIP; and mounting this combination of a pre-socketed DIP to the pre-drilled printed circuit board. The advantages of this simplified procedure are immediately evident. There is no carrier to be handled and disposed of or recycled; the DIP need not be inserted into the socket contacts already mounted in the panel board because the combination of socket contacts and DIP is combined in one step with the panel board. The combination of the DIP and the socket contacts mounted to the leads thereof (pre-socketed DIP), ready for mounting to a pre-drilled panel board, has not previously been known in the prior art.

The previously known and widely used pluggable approach, wherein DIP's may be plugged into an insulator socket or directly into the array of socket contacts is also possible with this invention because, after the socket contacts are wave soldered to the board, the DIP may be removed and substituted as desired. One primary advantage of this invention, other than greatly simplifying and speeding up panel board assemblies, is that the handling of IC's is minimized, reducing the possibility of damage to their relatively delicate leads. Additionally, wave soldering is available after the DIP is mounted to the board because the socket contacts act as heat sinks and as radiators. Further, the heat generated by the electronic circuitry is dissipated during operation, again because the socket contacts function as radiators. Direct soldering of DIP leads into printed circuit boards has not been widely employed because of possible damage to the electronic elements contained therein. Also, where socket contacts are used, it has been the practice to solder them into the board before plugging DIP's into them.

BRIEF DESCRIPTION OF THE DRAWING

The objects, advantages and features of this invention will be readily apparent from the following detailed description when read in conjunction with the accompanying drawing in which.

DESCRIPTION OF THE PREFERRED METHOD AND EMBODIMENTS

Figure 1:
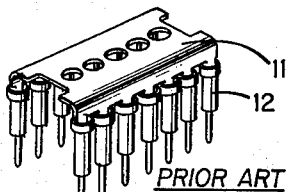
FIG. 1 shows the combination of a carrier and a plurality of lead sockets of the prior art.

With reference now to the prior art of FIG. 1, a lead socket carrier 11 has a plurality of lead sockets 12 mounted to the parallel projecting fingers of said carrier in a dual-in-line array configuration. This lead socket/carrier assembly has previously been employed to mount the lead sockets in a pre-drilled dual-in-line array of holes in printed circuit or panel boards. After the lead sockets have been properly inserted, the carrier is removed and is disposed of or recycled for subsequent similar use. DIP leads can then be inserted into the sockets of the socket contacts mounted to the board. The carrier may be made of plastic, metal or any relatively rigid material.

Figure 2:
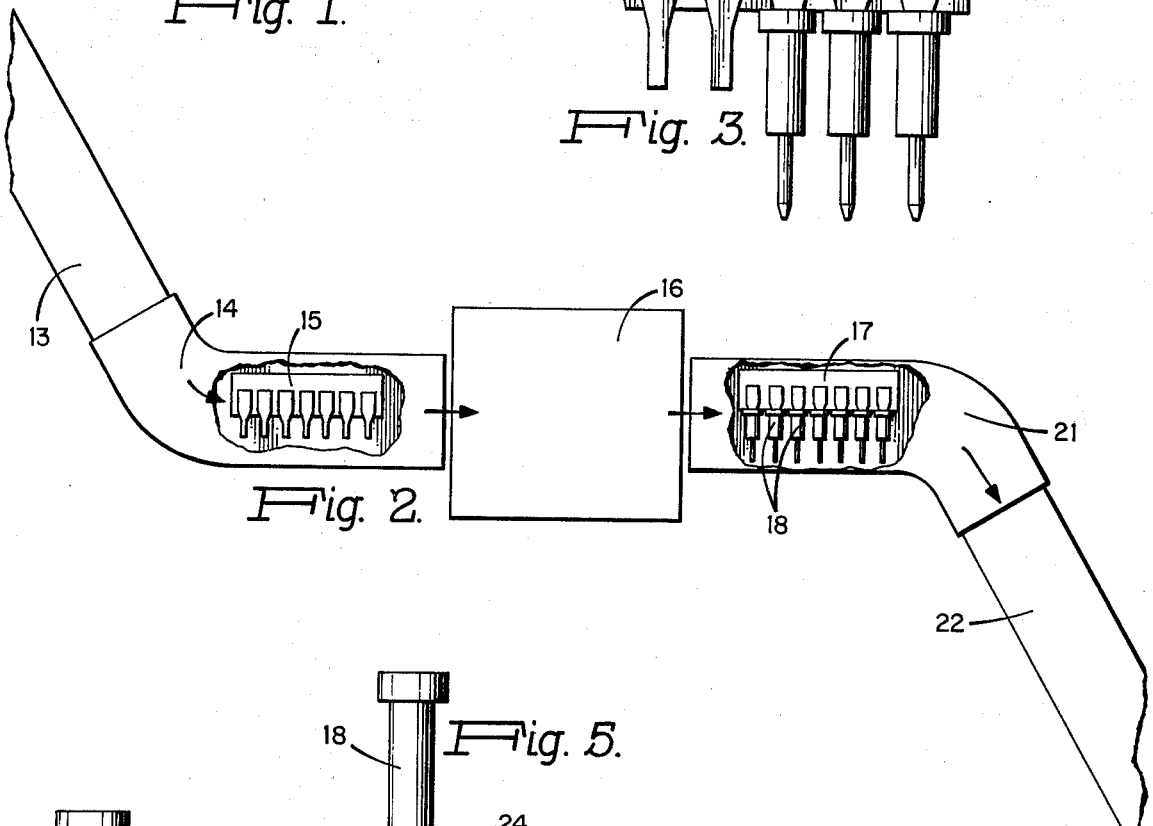
FIG. 2 is a semi-pictorial flow diagram of the method of the present invention.

The method of this invention is shown in the flow diagram of FIG. 2. A packaging device such as a conventional carrying stick or tube 13 having a plurality of DIP's therein is mounted to a feeder conduit 14 which feeds the DIP's 15 individually to a processor 16. Processor 16 arranges a multiplicity of socket contacts in properly spaced dual-in-line arrays and the electrical leads of each individual DIP are inserted into the sockets of the properly arranged socket contacts. This processor may be any means which accomplishes the desired end, and could be a machine which automatically arranges the socket contacts and combines them with the leads of the DIP. The leads of the DIP may be combined with the socket contacts either individually or, preferably, all of them simultaneously. The carrying stick 13 is a rigid tube of any suitable material such as metal and is normally used for safe and efficient handling, storage and transportation of a plurality of DIP's, normally 20–30 per stick.

Figure 4:
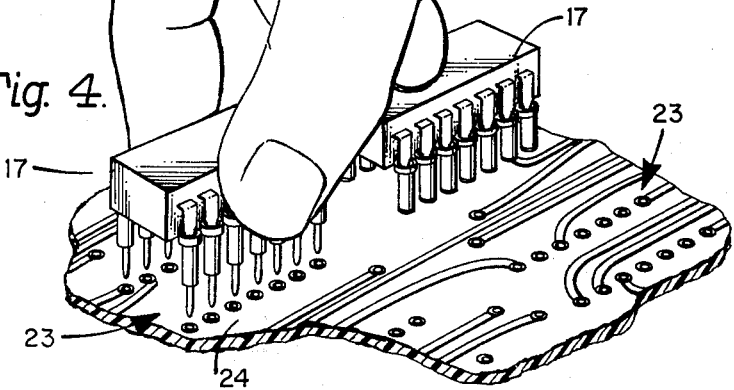
FIG. 4 is a perspective view of a portion of the top of a printed circuit board showing one DIP with lead sockets coupled thereto being mounted to a dual-in-line array of holes in the board and one such DIP in position for mounting.

The pre-socketed DIP 17 having socket contacts 18 mounted thereto by the processor is then moved through collecting conduit 21 to a packaging device such as carrying stick 22 for further handling, transportation or storage. Stick 22 may be identical with stick 13 or it may have a different configuration if desired. Preferably it will be the same since stick 13, when emptied, can be moved to the position of stick 22 to receive the pre-socketed DIP's. The pre-socketed DIP 17 may then be mounted either by hand or by machine, to a printed circuit or panel board as shown in FIG. 4 wherein the exposed ends of the socket contacts are simultaneously inserted into the holes in the dual-in-line arrays 23 in panel board 24. This is generally done by hand but automatic machines are available at a high cost.

Figure 5:
FIG. 5 is an enlarged partial sectional view showing one of the lead sockets mounted to the panel board in a high position.
Figure 6:
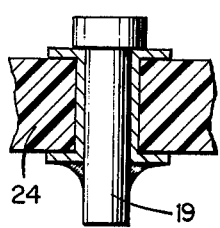
FIG. 6 is similar to FIG. 5 and shows a lead socket mounted to the panel board in a low position and without the solder tail.

Observe that, as shown in FIG. 4, the socket contacts are mounted in the high position (see FIG. 5). This is especially advantageous in that it permits soldering on both sides of the board to a particular terminal or socket contact, and, with smaller holes in the board, allows circuit traces between lines of holes in the array and between holes in a line. This latter feature permits increased circuit density. Plated-through holes were generally employed where circuit density requirements dictated that circuit traces be made on both sides of the board which connect to the same terminal. FIGS. 5 and 6 show socket contacts 18 and 19 respectively mounted in plated-through holes. However, with the high mounting position of FIGS. 4 and 5, it is possible to wave solder the bottom of the board and individually solder the top under the DIP. Thus the expense of plated-through holes can be significantly reduced. Furthermore, circuit traces on the printed circuit board in the vicinity of the dual-in-line array of socket contacts can easily be inspected, faults such as short circuits located and repaired without removing the DIP. There is improved air circulation under the DIP for purposes of cooling, and cleaning of the top of the board is facilitated. Upon insertion, the protruding tail 20 (FIG. 5) of the socket contacts are normally wave soldered on the side of the board opposite the integrated circuit package to make electrical connection to printed circuit traces and to firmly anchor the socket contacts to the board.

Figure 3:
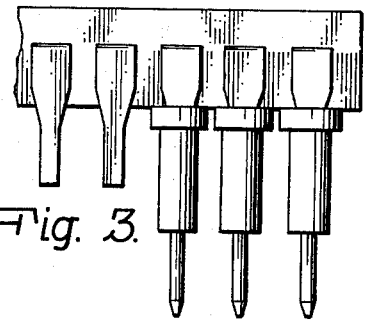
FIG. 3 is an enlarged partial view showing the leads of a DIP, some of which have socket contacts mounted thereto.

FIG. 3 shows a portion of a DIP having the electrical leads projecting therefrom, some of which have been coupled with socket contacts. This shows clearly the relationship between the electrical leads of the DIP and the socket contacts as the result of the action of the processor 16.

FIGS. 5 and 6 show optional mounting arrangements of the socket contacts 18 and 19 respectively in the holes in printed circuit board 24. FIG. 6 depicts the low position wherein the DIP is mounted relatively close to the surface of the board, with sufficient space for air circulation. This permits greater component and board density because the distance between adjacent facing boards can be minimized since the DIP's are mounted close to the board surface and the solder tail 20 of socket contact 18 has been removed to form socket contact 19. This permits decreased overall package size of the equipment being built. The high position previously discussed is shown in FIG. 5 and its relative advantages have been enumerated.

Although only one type of packaging device for the DIP's, that is, carrying sticks 13 and 22, are shown, it is likely that other types of elements could be used. For example, such a packaging device could have several rows of DIP's instead of one as shown, or they could be packaged side-by-side instead of end-to-end.

It is likely that those skilled in the art will be able to devise improvements and modifications which are suggested by the disclosure herein and which are within the scope of this invention.

What is claimed is:

1. A method for forming a pre-socketed dual-in-line electronic circuit package employing elongated socket contacts adapted to extend through the panel board to which it is normally mounted, said contact being formed with one blind end projecting from one side of said panel board and having on the opposite end a socket opening into the other side of the panel board, said socket being configured to receive and frictionally hold a lead projecting from a dual-in-line electronic circuit package, said dual-in-line electronic circuit package having two spaced parallel rows of leads projecting beyond one surface thereof, said method comprising the steps of:

feeding said dual-in-line electronic circuit packages individually to a processor;
   inserting each of the leads of one of said dual-in-line electronic circuit packages into the socket end of one of said socket contacts in said processor to form said pre-socketed dual-in-line electronic circuit packages whereby said socket opening frictionally engages said leads and said socket contacts project beyond said surface of said dual-in-line electronic circuit package in the manner of an extension of said leads; and
   collecting said separate pre-socketed dual-in-line electronic circuit packages in a packaging device in end-to-end adjacent contacting relationship.

2. The method recited in claim 1 and further comprising the step of arranging a plurality of socket contacts into spaced parallel rows in a dual-in-line configuration in said processor.

3. The method recited in claim 2 wherein said socket contacts are mounted to the leads of said dual-in-line package simultaneously in said processor.

4. A method for forming a pre-socketed dual-in-line electronic circuit package and mounting said thus formed package to electrical panel boards having pre-drilled dual-in-line arrays of holes therein, said packages employing elongated socket contacts formed with one blind end and having a socket at the other end, said socket being configured to receive and frictionally hold a lead projecting from a dual-in-line electronic circuit package, said dual-in-line electronic circuit package having two spaced parallel rows of leads projecting beyond one surface thereof, said method comprising the steps of:

feeding said dual-in-line electronic circuit packages individually to a processor;

inserting each of the leads of one of said dual-in-line electronic circuit packages into the socket end of one of said socket contacts is said processor to form said pre-socketed dual-in-line electronic circuit packages whereby said socket opening frictionally engages said leads and said socket contacts project beyond said surface of said dual-in-line electronic circuit package in the manner of an extension of said leads;

collecting said separate pre-socketed dual-in-line electronic circuit packages in a packaging device in end-to-end adjacent contacting relationship; and inserting said socket contacts of individual ones of said pre-socketed dual-in-line packages simultaneously into one of said dual-in-line arrays of holes in said panel board such that said blind end of said socket contacts extend from one side of said panel board.

5. The method recited in claim 4 and further comprising the step of arranging a plurality of socket contacts into spaced parallel rows in a dual-in-line configuration in said processor.

6. The method recited in claim 5 wherein said socket contacts are mounted to the leads of said dual-in-line package simultaneously in said processor.

7. The method recited in claim 6 wherein said dual-in-line packages are fed in tandem to said processor.

8. The method recited in claim 4, and further comprising the steps of:

attaching a packaging device having a plurality of integrated circuit packages therein to the input of said processor; and attaching an empty packaging device to the output of said processor to receive said pre-socketed dual-in-line packages.

9. The method recited in claim 4 wherein the step of inserting the socket contacts of said dual-in-line packages into said panel board results in the ends of said socket contacts projecting through said panel board, the method further comprising the step of wave soldering the ends of said socket contacts to said panel board.

10. The product made in accordance with the method of claim 1.

11. The product made in accordance with the method of claim 4.

* * * * *